United States Patent [19]

Frink et al.

[11] Patent Number: 4,598,964
[45] Date of Patent: Jul. 8, 1986

[54] SYSTEM FOR SECURING DATA WITHIN A COMPUTER

[75] Inventors: Attila Frink, Northridge; Robert A. Morrison, Long Beach, both of Calif.

[73] Assignee: Lockheed Corporation, Burbank, Calif.

[21] Appl. No.: 681,464

[22] Filed: Dec. 14, 1984

[51] Int. Cl.[4] ............................................. H01R 13/44
[52] U.S. Cl. ..................................... 339/37; 312/216; 339/82
[58] Field of Search .............. 339/37, 82, 75 R, 75 M; 312/216

[56] References Cited

U.S. PATENT DOCUMENTS

| | | | |
|---|---|---|---|
| 2,789,024 | 4/1957 | Heisler | 312/333 |
| 2,856,450 | 10/1958 | Padgett et al. | 174/52 |
| 2,888,308 | 5/1959 | Devine et al. | 312/310 |
| 2,893,137 | 7/1959 | Alling et al. | 35/19 |
| 2,913,296 | 11/1959 | Martin | 312/216 |
| 3,002,800 | 10/1961 | McMahan | 312/216 |
| 3,088,054 | 4/1963 | Meyer | 317/120 |
| 3,131,985 | 5/1964 | Blonder | 339/37 |
| 3,189,392 | 6/1965 | Mehlig, Jr. et al. | 312/216 |
| 3,217,211 | 11/1965 | Norden | 317/103 |
| 3,257,602 | 6/1966 | Potter et al. | 321/8 |
| 3,717,805 | 2/1973 | Gnaedinger et al. | 321/8 R |
| 4,277,120 | 7/1981 | Drake et al. | 312/320 |
| 4,479,688 | 10/1984 | Jennings | 339/37 |

*Primary Examiner*—Gil Weidenfeld
*Assistant Examiner*—Paula A. Austin
*Attorney, Agent, or Firm*—Louis L. Dachs

[57] ABSTRACT

The invention is a system for securing the data stored within a computer. The system 10 includes a cabinet 11 having a peripheral frame 12 with at least one drawer 22C having a front panel 24C moveable from a closed position to an open position. The drawer 22C is adapted to hold that portion 26 of the computer containing the data to be secured. The system further comprises electrical connector halves 28, 29 mounted in the front panel 24C of the drawer 22C having electrical cables 30 and 31 coupled to the portion 26 of the computer therein. The connectors are adapted to mate with external electrical connector halves 32, 33 attachable thereto. A cover 48, mounted to the cabinet, is moveable from a first position covering the electrical connector halves 28, 29 to a second position allowing access thereto. A lock 63 is provided which is adapted to lock the cover to the cabinet.

9 Claims, 8 Drawing Figures

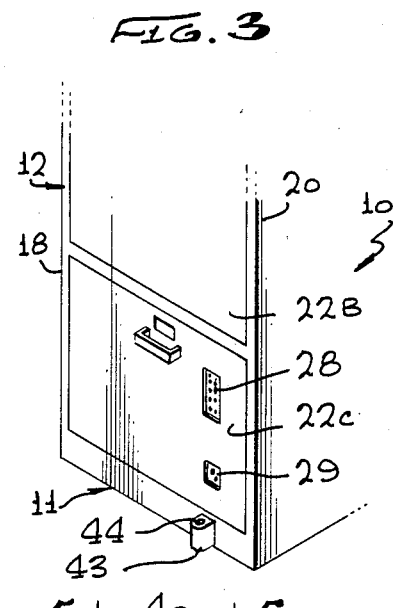
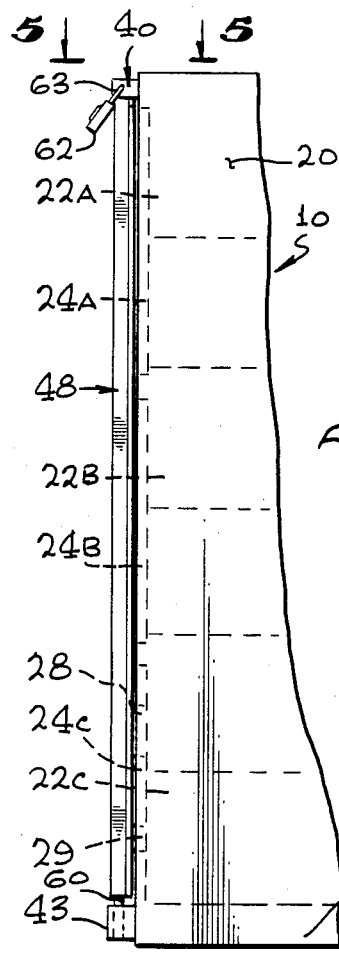
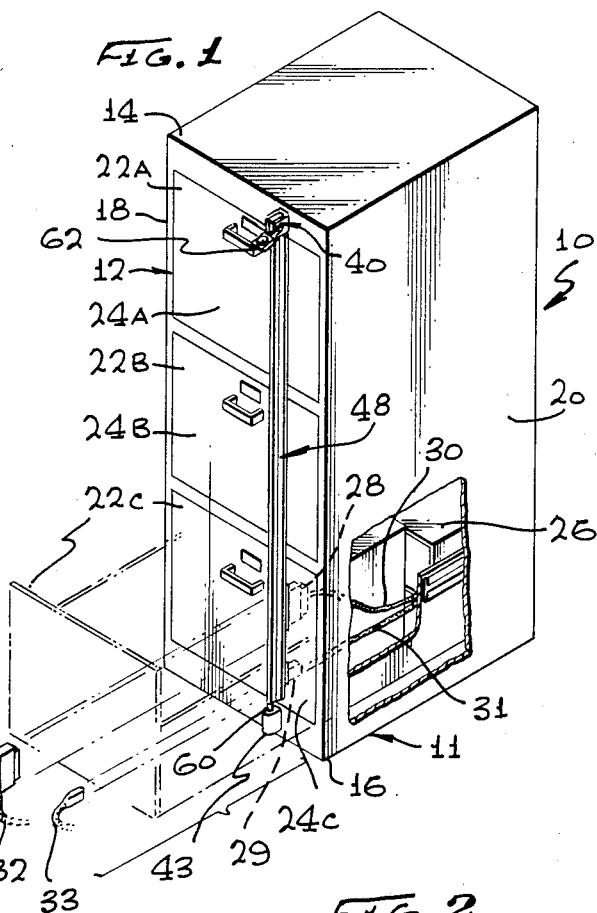
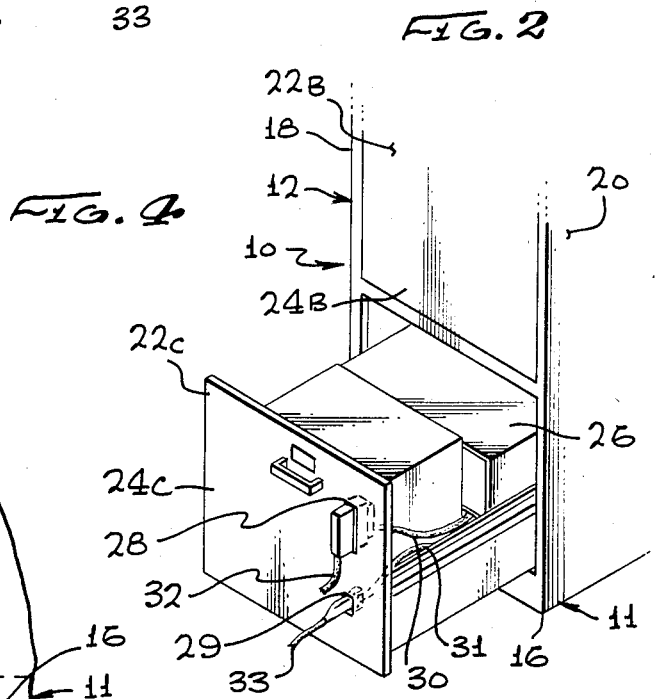

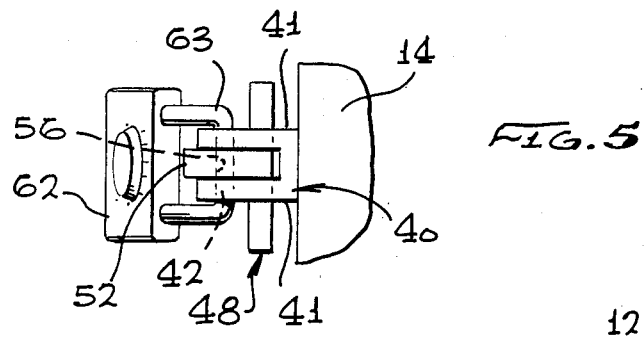
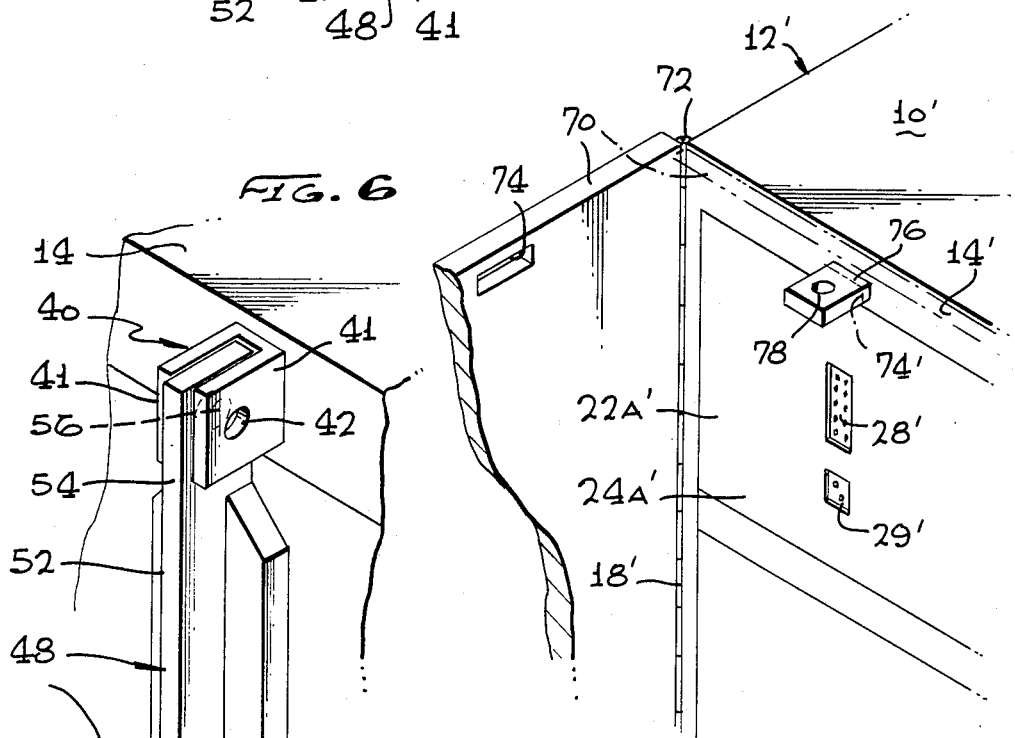
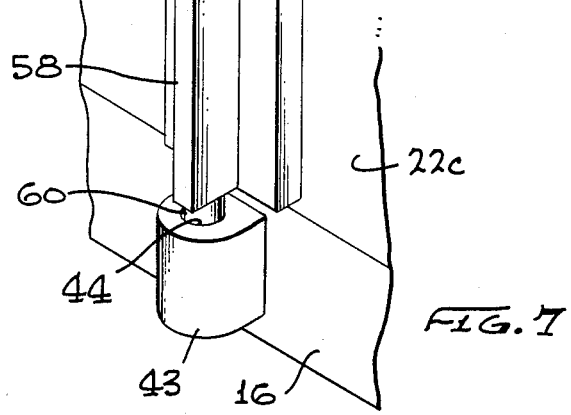

SYSTEM FOR SECURING DATA WITHIN A COMPUTER

TECHNICAL FIELD

The system relates to the field of securing systems and, in particular, to a system for preventing unauthorized access to data stored within a computer.

BACKGROUND INFORMATION

Generally, the prevention of unauthorized access to computer programs and/or data stored in computer memory banks require that the computer, or the portions thereof containing the data, be located in areas where access can be limited to only essential personnel. Additionally, secret passwords are required to "enter" the particular computer program. Passwords are particularly useful when the computer is accessed via telephone lines from remote locations. If government classified information is involved, doors incorporating cypher locks are often used. While such methods are quite practical to use with large, centrally located computers, their use with smaller computers is generally impractical. In any large company, several hundred small "personal" computers may be dispersed throughout many facilities. In such cases the typical procedure has been to remove the tapes, hard disks or floppy disks and store them in a safe or a securable cabinet. This is a particular necessity if the data or program is classified under a government contract. It is a time-consuming procedure and is particularly awkward to implement if periodic use during any work shift is contemplated. If the data is permanently fixed with the computer or a portion thereof, this latter procedure is unusuable.

Prior art patents of interest include U.S. Pat. No. 2,789,024, "Rack-Mount Arrangement" by J. L. Heisler; U.S. Pat. No. 2,856,450, "Cabinet Installed Electronic Apparatus" by W. C. Padgett et al.; U.S. Pat. No. 2,888,308, "Structure of Cabinets for Electrical Apparatus" by F. P. Devine et al.; U.S. Pat. No. 2,893,137, "Portable Training Device for Electric Accounting Machine Operators" by J. F. Alling et al.; U.S. Pat. No. 3,088,054, "Electrical Apparatus" by S. Meyer; U.S. Pat. No. 3,217,211, "Electrical Control Apparatus" by A. R. Norden; U.S. Pat. No. 3,257,602, "Portable Power Supply" by E. G. Potter et al.; U.S. Pat. No. 3,717,805, "Electrical Power Center for Recreational Vehicles" by D. J. Gnaedinger et al., and U.S. Pat. No. 4,277,120, "Printed Circuit Board Storage Cabinet" by L. O. Drake et al.

Thus, it is a primary object of the subject invention to provide a system wherein the data stored in the computer can be secured in the area where use of the computer is contemplated.

It is another object of the subject invention to provide a system wherein that portion of the computer containing the data can be stored in a conventional filing cabinet or the like.

It is a still further object of the subject invention to provide a system wherein not only unauthorized use of the data stored within the computer is prevented but access to the computer itself is prevented.

DISCLOSURE OF INVENTION

The invention is a system for securing data stored within a computer. The system comprises a storage means adapted to store that part of the computer containing the data to be secured therein. The storage means includes a cabinet having a peripheral frame with at least one drawer having a front panel moveable from a closed position to an open position. The drawer is adapted to hold that part of the computer containing the data to be secured.

The system further comprises electrical connector means adapted to electrically couple the part of the computer to the exterior of the cabinet. The connector means includes at least one electrical connector half mounted in the front panel of the at least one drawer having an electrical cable coupled to that part of the computer therein. The connector is adapted to mate with an external electrical connector half attachable thereto.

A securing means is adapted to prevent access to the electrical connector means from the exterior of the cabinet. The securing means includes a cover moveable from a first position covering the electrical connector half to a second position allowing access thereto and locking means adapted to lock the cover in the first position. The locking means includes a receptacle mounted to a lower portion of the peripheral frame of the cabinet and a clevis having an aperture therethrough mounted to the upper portion of the peripheral frame. A rod is attached to the lower end of the cover, while the top end of the cover incorporates a lug having an aperture therethrough. A lock is provided adapted to lock the lug to the clevis. Thus, when the rod is installed in the receptacle and the lug is mated with the clevis, the apertures in the clevis and lug are aligned, allowing the cover to be locked in place.

In a second embodiment the cover is rotatably mounted to one side of the peripheral frame and is moveable from a first position extending over a portion of the drawer to a second position clear thereof. In this embodiment the connector half is positioned on the drawer sufficiently close to the side of the cabinet such that when the cover is in the first position it covers the connector half. The top portion of the peripheral frame includes a lug with an aperture therethrough while the cover incorporates a slot positioned so that when the cover is in the first position, the slot fits over the lug. In this position, the cover can be locked in place.

The novel features which are believed to be characteristic to the invention, both as to its organization and method of operation, together with further objects and advantages thereof, will be better understood from the following description connected with the accompanying drawings in which presently preferred embodiments on the invention are illustratecd by way of examples. It is to be expressly understood, however, that the drawings are for purposes of illustration and description only and are not intended as a definition of the limits of the invention.

BRIEF DESCRIPTION OF THE DRAWINGS

Illustrated in FIG. 1 is a perspective view of a cabinet partially broken away to show the interior of one drawer.

Illustrated in FIG. 2 is a partial perspective view of the cabinet with the drawer partially open and the computer electrically coupled to external cables by means of electrical connector halves mounted on the front panel of the drawer.

Illustrated in FIG. 3 is a partial perspective view of the cabinet with the drawer in the closed position.

Illustrated in FIG. 4 is a partial side-elevation view of the cabinet in the secured position with a cover secured to the cabinet preventing access to the electrical connector halves mounted on the front panel of the drawer.

Illustrated in FIG. 5 is a partial view of the cabinet shown in FIG. 4 taken along the line 5—5 with the cover engaged in a clevis mounted on the cabinet.

Illustrated in FIG. 6 is a partial perspective view of the upper portion of the cabinet shown in FIG. 1 particularly showing the cover in position for securing the electrical connectors.

Illustrated in FIG. 7 is an enlarged partial view of the lower portion of the cabinet shown in FIG. 1 with the bottom of the cover installed in a receptacle mounted on the cabinet.

Illustrated in FIG. 8 is a partial perspective view of an alternate embodiment wherein the cover is rotatably mounted to the cabinet.

BEST MODE FOR CARRYING OUT THE INVENTION

Referring to FIGS. 1-4, it can be seen that the system, generally designated by numeral 10, comprises a cabinet 11 having a peripheral frame 12. The peripheral frame 12 includes upper and lower portions 14 and 16, respectively, and side portions 18 and 20. Moveably mounted, in a conventional manner, within the frame 12 are a plurality of drawers 22A, B, C, having front panels 24A, B, C, respectively, the drawers being moveable from an open position to a closed position. Mounted within one or more of the drawers 22A-22C is a computer or a portion 26 thereof. For purposes of illustration, only drawer 22C is shown having a portion 26 mounted therein. Thus, it is to be understood that the cabinet need only have one drawer and could have more than the three drawers indicated. Also, while a cabinet with pull-out drawers is illustrated, a regular storage cabinet with doors and shelves would suffice. Typically, the computer portion 26 may have data in the form of a computer program, data base, etc., stored therein. Most often the data will be stored on a tape, hard disk or floppy disk, etc. Regardless of form, it is this data for which security is sought.

Mounted in the front panel 24C are a plurality of electrical connectors. For purposes of illustration, a zero-insertion-force type electrical connector half 28, and a conventional three-pronged connector half 29 are illustrated. Note that the connector halves are aligned, in this case vertically aligned, for reasons which will be subsequently discussed.

The connector halves 28 and 29 are coupled to the computer portion 26 by means of internal electrical cables 30 and 31, respectively. If a regular storage cabinet is used, the lengths of the cables 30 and 31 would have to be sufficiently long so as to allow the doors to swing open.

Particularly referring to FIG. 2, when the computer portion 26 is in use, external cables 32 and 33 are coupled to connectors 28 and 29, respectively. The cable 32 would be coupled to a display terminal, keyboard, etc., while cable 33 would be coupled to a power source (not shown). Note that the drawer 22C is shown open in FIG. 2. This, of course, is not a necessity but may be desirable for cooling purposes.

Still referring to FIGS. 1-4 and, additionally, to FIGS. 5-7, the cabinet 11 along the upper peripheral frame 14 incorporates a clevis 40 having a pair of legs 41 including apertures 42 therethrough. The lower peripheral frame portion 46 incorporates a retainer 43 having an aperature 44 therethrough. The clevis 40 and retainer 43 are vertically aligned with the connector halves 28 and 29. A cover 48 in the shape of a T-bar includes an upper end 52 terminating in a lug 54 with an aperture 56 therethrough. The lower end 58 of the cover 48 terminates in a rod member 60 adapted to engage aperture 44 in retainer 43.

With the rod 60 engaged in aperture 44 and lug 54 engaged with the clevis 40, the apertures 42 of the legs 41 will be aligned with aperture 56 in the lug 54. Thus, the cover 48 can be locked in place by lock 62, with locking bar 63 thereof extending through apertures 42 and 56. This will position the cover 48 directly over the connector halves 28 and 29 preventing access thereto and, additionally, locking all the drawers in the closed position, securing the data and any other items within the drawers of the cabinet.

Illustrated in FIG. 8 is an alternate embodiment of the system, designated generally by numeral 10', wherein a cover 70 is rotatably mounted to the side portion 18' of the peripheral frame 12' of a cabinet 11' by means of a piano hinge 72 (details not shown). The cover 70 incorporates a slot 74. The upper peripheral frame portion 14' incorporates a lug 76 having an aperture 78 therethrough. Thus, when the cover 70 is rotated over the cabinet 11', the lug will protrude through the slot 74 (indicated in dotted lines). Thereafter, the lock 62 can be used to secure the cover. Thus, electrical connector halves 28' and 29' mounted in the top drawer 22A' will be secured. The advantage of this embodiment is that the cover remains attached and does not require separate storage during use of the computer.

Thus, it can be seen that the portion of the computer can be secured within the cabinet. Any tapes, hard disks, or floppy disks therein need not be removed, for access to the data via the electrical connector halves, or to the computer portion itself, cannot be obtained with the cover locked in place.

While the invention has been described with reference to a particular embodiment, it should be understood that the embodiments are merely illustrative as there are numerous variations and modifications which may be made by those skilled in the art. Thus, the invention is to be construed as being limited only by the spirit and scope of the appended claims.

Industrial Applicability

The system has applicability to computer systems where access to computer programs and data stored therein must be limited.

We claim:

1. A system for securing data stored within a computer comprising:
   a cabinet having an interior portion adapted to hold that part of the computer containing the data to be secured therein;
   electrical connector means coupled to said cabinet adapted to electrically couple the part of the computer to the exterior of said cabinet; and
   securing means adapted to prevent access to said electrical connector means from the exterior of said cabinet.

2. A system as set forth in claim 1 wherein said cabinet comprises:
   a peripheral frame; and
   at least one drawer, having a front panel, mounted within said peripheral frame moveable from a closed position to an open position, said drawer adapted to hold said portion of said computer containing the data to be secured.

3. The system as set forth in claim 2 wherein said connector means comprises at least one electrical connector half mounted in said front panel of said at least one drawer having an electrical cable coupled to the part of the computer therein, said electrical connector adapted to mate with an external electrical connector half attachable thereto.

4. The system as set forth in claim 3 wherein said securing means comprises:
   a cover moveable from a first position covering said electrical connector half to a second position allowing access to said electrical connector half; and
   locking means adapted to lock said cover in said first position.

5. The system as set forth in claim 4 wherein said cover and locking means also adapted to lock said at least one drawer in said closed position when said cover is in said first position.

6. The system as set forth in claim 5 wherein there are at least two electrical connectors, said at least two electrical connectors being aligned such that said cover when in said first position covers all of said connectors.

7. The system as set forth in claim 6 wherein said locking means comprises:
   a receptacle mounted to a lower portion of said peripheral frame of said cabinet;
   a clevis having an aperture therethrough mounted to the upper portion of said peripheral frame;
   a rod attached to the lower end of said cover;
   a lug having an aperture therethrough attached to the top end of said cover, said lug adapted to mate with said clevis; and
   a lock adapted to lock said lug to said clevis;
   such that when said rod is installed in said receptacle and said lug is mated with said clevis, said apertures in said clevis and said lug are aligned allowing a portion of said lock to pass through said apertures.

8. The system as set forth in claim 6 wherein said cover is rotatably mounted to said peripheral frame moveable from a first position over said at least one drawer to a second position to the side of said drawer; and
   said connector means mounted in said at least one drawer is sufficiently close to the side of said cabinet such that when said cover is in said first position, said connector means is covered by said cover.

9. The system as set forth in claim 8 wherein said locking means comprises:
   a lug having an aperture therethrough mounted to said peripheral frame of said cabinet;
   said cover having a slot therein, said slot positioned on said cover such that when said cover is in said first position said lug protrudes through said slot; and
   a lock adapted to engage said aperture such that when said cover is in said first position, said lock can secure said cover in that position.

* * * * *